United States Patent [19]

Sheen

[11] Patent Number: 5,578,930
[45] Date of Patent: Nov. 26, 1996

[54] MANUFACTURING DEFECT ANALYZER WITH IMPROVED FAULT COVERAGE

[75] Inventor: Timothy W. Sheen, Brighton, Mass.

[73] Assignee: Teradyne, Inc., Boston, Mass.

[21] Appl. No.: 405,478

[22] Filed: Mar. 16, 1995

[51] Int. Cl.⁶ .................................................. G01R 31/08
[52] U.S. Cl. ........................... 324/530; 324/529; 324/750
[58] Field of Search .................................... 324/530, 529,
324/512, 522, 527, 750, 761, 538, 555,
67, 754

[56] References Cited

U.S. PATENT DOCUMENTS

| | | | |
|---|---|---|---|
| 3,719,883 | 3/1973 | Pentecost | 324/51 |
| 3,906,514 | 9/1975 | Phelan | 343/895 |
| 3,925,784 | 12/1975 | Phelan | 343/754 |
| 3,949,407 | 4/1976 | Jagdamann et al. | 343/895 |
| 4,517,511 | 5/1985 | Suto | 324/529 |
| 5,124,660 | 6/1992 | Cilingiroglu | 324/538 |
| 5,254,953 | 10/1993 | Crook et al. | 324/538 |
| 5,365,163 | 11/1994 | Satterwhite et al. | 324/530 |
| 5,391,993 | 2/1995 | Khazam et al. | 324/684 |
| 5,406,209 | 4/1995 | Johnson et al. | 324/750 |
| 5,426,372 | 6/1995 | Freve | 324/538 |
| 5,498,964 | 3/1996 | Kerschner et al. | 324/530 |

*Primary Examiner*—Louis M. Arana
*Attorney, Agent, or Firm*—Edmund J. Walsh

[57] ABSTRACT

A manufacturing defect analyzer for printed circuit boards which can detect open circuit faults between leads of components and the printed circuit board. The manufacturing defect analyzer can operate in an inductive coupling mode or a capacitive coupling mode. The same sensors are used in each mode, allowing different leads on the same part to be tested using either technique. A method is also disclosed whereby the device is used to rapidly and accurately detect manufacturing defects.

21 Claims, 3 Drawing Sheets

MANUFACTURING DEFECT ANALYZER WITH IMPROVED FAULT COVERAGE

This invention relates generally to equipment for testing printed circuit boards and more specifically to equipment for detecting manufacturing defects on a printed circuit board.

A manufacturing defect analyzer is described in U.S. Pat. No. 5,124,660 to Cilingiroglu. In that manufacturing defect analyzer, a metallic electrode, shaped generally as a flat plate, is placed above a component on a printed circuit board. The electrode is driven by an oscillator, which generates an electric field. The electric field couples to the lead structure on the component under test. This type of coupling is termed "capacitive coupling."

Test probes are attached to the printed circuit board to measure the signal capacitively coupled to the board. To determine whether a particular lead of the component under test is properly connected to the printed circuit board, the traces on the printed circuit board to which that lead are connected are connected to a current measuring device. The other traces on the board are connected to ground to avoid a spurious signal. This is called "guarding."

If the current measuring device detects a current, it indicates that there is a conducting path from the lead frame of the component to the printed circuit board. If no current is detected, it indicates that there is a break between the lead frame of the component under test and the printed circuit board. Such a break indicates a manufacturing defect.

A similar system is disclosed in U.S. Pat. No. 5,254,953 to Crook et al. In that patent, a test signal is capacitively coupled between the lead frame of a component under test and a conductive electrode in the shape of a flat plate. Both the aforementioned U.S. Pat. Nos. 5,124,660 and 5,254,953 are hereby incorporated by reference.

An alternative test technique is disclosed in copending U.S. Pat. No. application Ser. No. 08/227,854 for a Printed Circuit Board Tester, filed Apr. 15, 1994 by Sheen et al.

That patent describes a manufacturing defect analyzer in which an antenna array is placed above a component under test on the printed circuit board. The antenna array is configured to produce a magnetic field in the component under test.

Test probes are attached to the printed circuit board in a way which forms a loop incorporating leads of the component under test. Other traces are also grounded. If the component under test is properly connected to the printed circuit board, that loop is a conducting loop. As a magnetic field induces a voltage in a conducting loop, a voltage is induced when the component under test is properly connected to the printed circuit board. If a voltage is not detected, a manufacturing defect is indicated. This method of coupling a test signal to the printed circuit board is termed "inductive coupling."

The aforementioned U.S. Pat. application Ser. No. 08/227,854 is also hereby incorporated by reference.

We have recognized that each approach, capacitive coupling and inductive coupling, has certain drawbacks. Each approach can detect faults in only some of the leads on the printed circuit board. The percentage of the total leads on a board for which faults can be detected is termed the fault coverage of the device. Ideally, the fault coverage should be 100%. However, fault coverage of capacitive and inductive techniques can be as low as 80% for some types of printed circuit boards.

Some factors which limit the effectiveness of these techniques relate to the specific types of components being tested. Capacitive coupling is less effective on components with ground shields. Inductive coupling is less effective for testing sockets without components in them.

Other drawbacks we have identified relate to the specific way that leads on a component under test are connected to the printed circuit board. The actual signal which is capacitively coupled to the current measuring device depends on the ratio of the capacitance between the electrode and the lead frame of the component under test and the capacitance of the rest of the network of components. Generally, the capacitance between the electrode and the lead frame is very small. As a result, the capacitively coupled signal is very small.

Generally, the inductively coupled signal will be larger than the capacitively coupled signal. A larger signal allows more accurate measurements to be made. However, we have identified circumstances when the inductively coupled signal will not be larger. When multiple components are connected to the same node on the printed circuit board, it is possible that the inductively coupled signal will be smaller than the capacitively coupled signal.

As described in the aforementioned U.S. Pat. application Ser. No. 08/227,854, the conducting loop on the printed circuit board is formed by imposing a bias current on the printed circuit board. This bias current forward biases the substrate diode which inherently exists in semiconductor components. If the substrate diode of the component under test has a higher turn on voltage than the substrate diodes of other components attached to the same node, most of the bias current will flow into the other components rather than the component under test. If too little bias current flows into the component under test, its substrate diode will not be fully forward biased. In that case, a very small' signal is induced on the board. Further, the bias current flow into other components on the node forward biases their substrate diodes. The forward biased diodes represent alternative conducting paths which form a voltage divider, further reducing the signal available for measurement.

Thus, for specific leads of a component under test, capacitive coupling may provide a larger signal and therefore a more accurate result. We have recognized that a significant advantage can be obtained by providing a manufacturing defect analyzer which could test components using either capacitive coupling or inductive coupling. We have also recognized that a significant advantage could be obtained with a manufacturing defect analyzer which can be easily configured for either capacitive coupling tests or inductive coupling tests and that this reconfiguration could be performed on a pin by pin basis.

SUMMARY OF THE INVENTION

With the foregoing background in mind, it is an object of the invention to provide a manufacturing defect analyzer with a high rate of fault coverage.

It is also an object to provide a manufacturing defect analyzer which can perform capacitive coupling tests or inductive coupling tests.

It is a further object to provide a manufacturing defect analyzer which can test a component for manufacturing defects with either a capacitive or inductive technique on a pin by pin basis.

It is a still further object to provide a manufacturing defect analyzer with improved accuracy.

The foregoing and other objects are achieved with a manufacturing defect analyzer having a sensor with antenna elements arranged in groups in two parallel planes. The groups can be driven separately by out of phase signals to produce a magnetic field for an inductive coupling test. One signal can be applied between the two groups to create an electric field for a capacitive coupling test.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
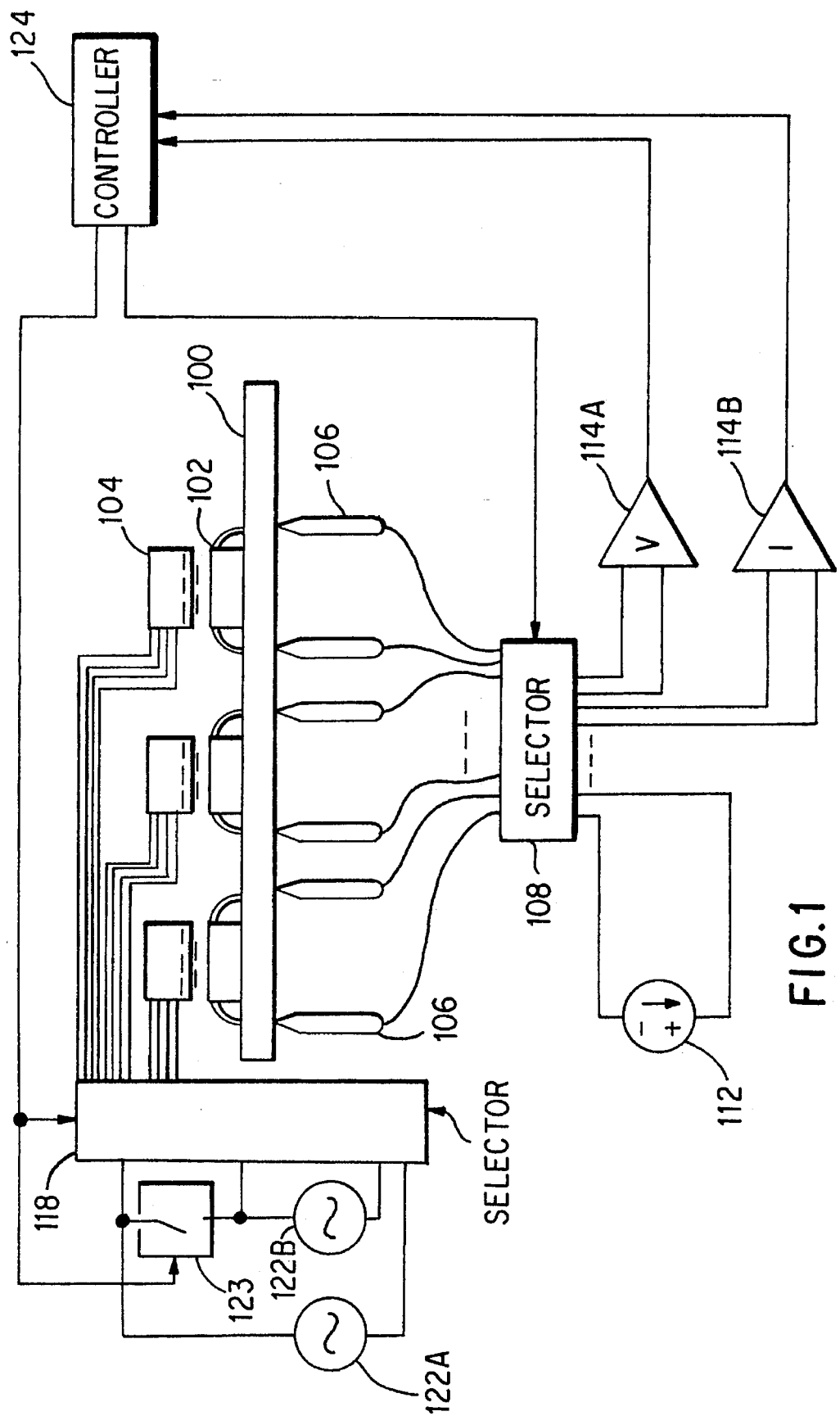
FIG. 1 shows a schematic of the test system according to the invention.

FIG. 1 shows a board under test 100. Numerous components 102 are mounted to board 100. As in a conventional board test system, board 100 is mounted in a fixture (not shown).

Sensors 104 are mounted above each component 102 to be tested. Sensors 104 are mounted in any convenient way, such as to an over clamp of the fixture (not shown). Compliant supports are preferably used. Dielectric material is preferably inserted between sensors 104 and components 102. The dielectric material prevents sensors 104 from shorting to components on board 100. Preferably, the dielectric material is as thin as possible to allow sensors 104 to be close to components 102.

Sensors 104 are described in greater detail in conjunction with FIG. 2 below. Each sensor 104 has inputs which can be driven to either create a magnetic field or an electric field through components 102. The term "sensor" as used herein refers to an element which serves as the point of transition between an electrical conductor and an electromagnetic field in a dielectric. In the preferred embodiment, "sensors" are used to launch electric and magnetic fields. However, in alternative embodiments the same elements could be used to receive such fields.

Electrical contact is made to the underside of printed circuit board 100 through nails 106. Nails 106 preferably make up a bed of nails as in a conventional circuit board tester. Nails 106 make contact to the conductive traces on printed circuit board 100 which should be connected to the leads (not numbered) of components 102.

Nails 106 are connected to a selector 108. Connections may be made through selector 108 to a voltage meter 114A or a current meter 114B. Selector 108 may connect these meters to any one of the nails 106 so that either voltage or current signals at any point on printed circuit board 100 can be measured.

Selector 108 is also connected to a bias current source 112. Bias current source 112 can be connected to any point on printed circuit board 100 to establish a conducting loop for inductive coupling testing.

The measurements made by voltage meter 114A and current meter 114B are passed to controller 124. Preferably, controller 124 is a microprocessor and the values are passed in digital form.

Controller 124 is programmed to run a test program. It generates the required control inputs to selector 108 to connect the meters 114 and bias source 112 to points on the printed circuit board 100. Connections are made to test whether each lead of each component 102 is properly connected to printed circuit board 100. Each lead may be tested using capacitive coupling or inductive coupling.

For a capacitive coupling test, selector 108 connects current meter 114B to the circuit nodes on printed circuit board 100 as described in the aforementioned U.S. Pat. No. 5,124,660 to Cilingiroglu. For inductive testing, selector 108 connects voltage meter 114A and bias source 112 to the circuit nodes on printed circuit board 100 as described in the aforementioned U.S. patent application Ser. No. 08/227,854 for a Printed Circuit Board Tester by Sheen et al.

Stimulation signals for the test come from sources 122A and 122B. Sources 122 are RF sources. They are designed to operate at the same frequency. The relative phase of the sources 122 should also be controllable. For inductive coupling, preferably the sources are out of phase by 90°. For capacitive coupling, preferably the sources are in phase.

Sources 122A and 122B can be connected together through switch 123. Switch 123 is closed for capacitive coupling and effectively doubles the input power.

Sources 122 are connected to selector 118. Selector 118 is connected to each of the sensors 104. Each sensor 104 has a plurality of inputs, as described in greater detail below. Selector 118 is a switch matrix which allows the sources 122 to be connected to the inputs of one sensor 104 at a time.

Figure 2:
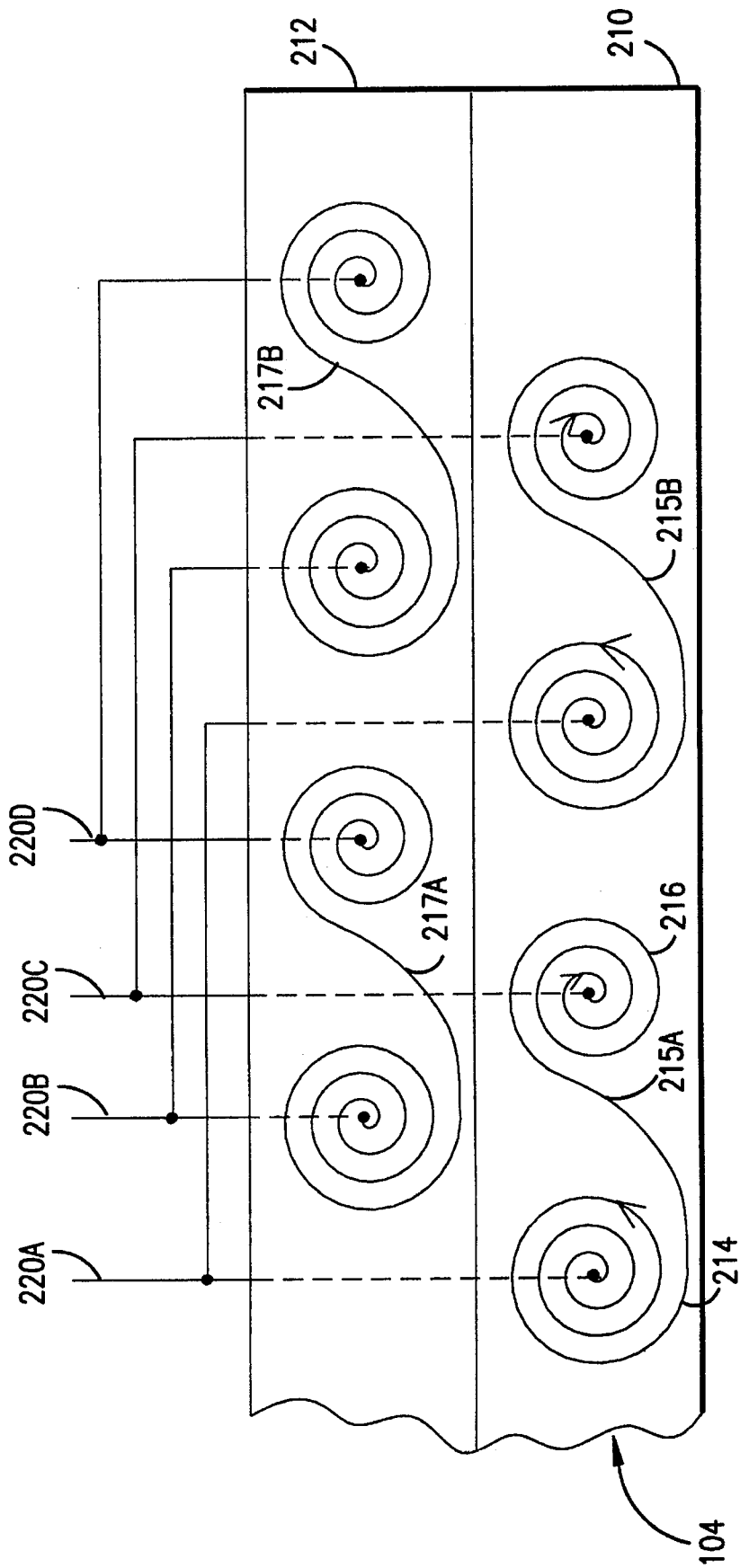
FIG. 2 shows in schematic form the sensor elements of FIG. 1.

Turning now to FIG. 2, a portion of one of the sensors 104 is shown schematically. As describe in the aforementioned U.S. patent application Ser. No. 08/227,854, each sensor 104 is made up of groups of spiral loop antenna elements on a printed circuit board. FIG. 2 shows the electrical connection to the spiral loop antennas. As actually fabricated, the spiral loops will be on the surface of the layers of the printed circuit board and do not have the orientation used in FIG. 2 to show electrical connection.

The spiral antenna elements are configured in two groups which are driven with signals 90° out of phase. Within each group, adjacent spiral antenna elements are wound in opposite directions.

FIG. 2 shows layers 210 and 212 of a multilayer printed circuit board. One group of antenna elements is formed on layer 210. The other group of antenna elements is formed on layer 212. As shown in FIG. 2, the groups are staggered so that one antenna element on layer 212 is between each antenna element in layer 210.

The antenna elements in each group are made up of pairs. For the group formed on layer 210, pairs 215A and 215B are shown. For the group on layer 212, pairs 217A and 217B are shown. Each pair is made up of a counter clockwise spiral 214 and a clockwise spiral 216. When the group on layer 212 is driven with a signal which is 90° out of phase with the signal used to drive the group on layer 210, this configuration of spiral antenna elements will result in each antenna element advancing in phase 90° in comparison to an adjacent antenna element.

The pairs of antenna elements in each group are connected in parallel through circuit traces on the printed circuit board on which sensor 104 is formed. Thus, there are four input terminals to sensor 104. Terminal 220A connects to the counter clockwise spirals of the antenna elements on layer 210. Terminal 220B connects to the counter clockwise spirals of the antenna elements on layer 212. Terminal 220C connects to the clockwise spirals of the antenna elements on layer 210. Terminal 220D connects to the clockwise spirals of the antenna elements on layer 212.

For inductive coupling, RF source 122A is connected between terminals 220A and 220C. RF source 122B is 90° out of phase with source 122A and is connected between terminals 220B and 220D. A magnetic field is generated as described in the aforementioned U.S. patent application Ser. No. 08/227,854.

For capacitive coupling, sources 122A and 122B are in phase and connected together. One side of the sources 122 is connected to both terminals 220A and 220C. The other side of the sources 122 are connected to both terminals 220B and 220D.

Figure 3:
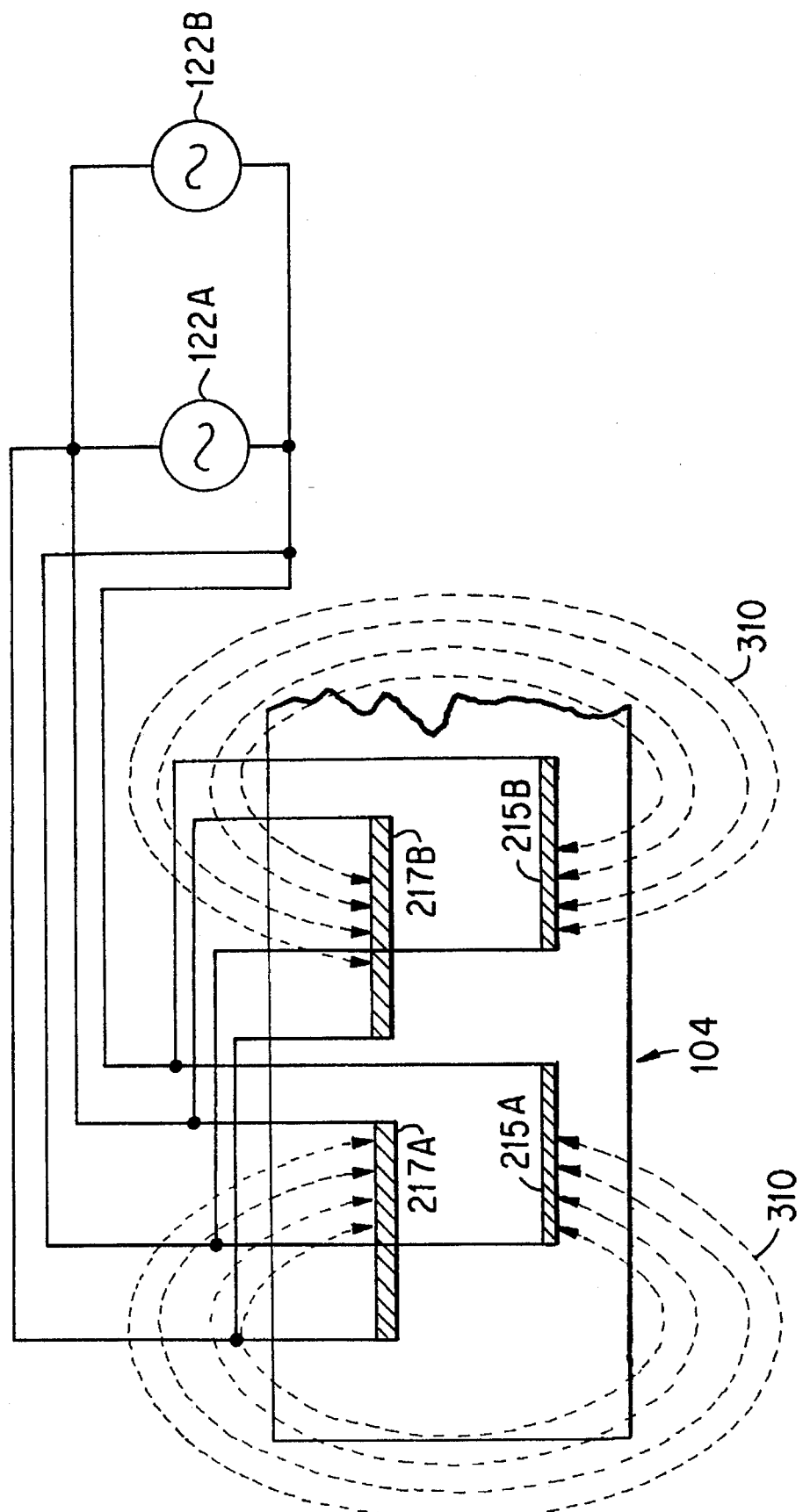
FIG. 3 shows the generated electric field when the sensor of FIG. 2 is configured for capacitive coupling.

The electric field 310 which results from the connection as described above is shown diagramatically in FIG. 3. The antenna elements on layer 210 are connected together and act similarly to a conductive plate. The antenna elements on layer 212 are similarly connected together and act like a conducting plate. To first order, the electric field in the vicinity of two conductive plates is as shown in FIG. 3.

Electric field 310 extends beyond sensor 104 and penetrates components 102. In this way, a signal can be capacitively coupled to the components for a test as described in the aforementioned U.S. Pat. No. 5,124,660 to Cilingiroglu.

As shown in FIG. 1, the same hardware can be used to make measurements using capacitive coupling or inductive coupling. The hardware can be reconfigured simply by changing the connections within selector 108, selector 118 and switch 123. All of these elements operate under control of controller 124.

Controller 124 stores a test program. The test program is developed by a person or by a computer running computed assisted design software. It includes commands to configure the hardware shown in FIG.1 to test each lead of each component 102 on printed circuit board 100. Further commands in the program then cause measurements to made and compared to threshold values. Measurements below a threshold value indicate a faulty connection of a lead to the printed circuit board. The test program also includes commands to report the faults to a user in some convenient fashion, such as a report or an alarm.

Because the invention allows each lead to be tested with either a capacitive or inductive technique, the commands within the test program can configure the hardware for either a capacitive test, an inductive test or both. The test method is preferably selected for each lead to give the largest signal when the lead is properly connected. This information can be obtained by analyzing the design of the printed circuit board when the test program is written.

Alternatively, the information can be obtained by measurements on a known good board during a "learn mode." In the learn mode, the controller 124 is programmed to measure the signals capacitively and inductively coupled to each lead. The technique yielding the larger signal level can be identified and included in the test program for that lead. Also, the measured values can be used to set the thresholds used to identify a fault. The threshold should be slightly lower than the measured value on the known good board.

Having two measurement techniques available also allows both techniques to be used simultaneously for greater accuracy. For example, rather than having a single threshold, two thresholds might be established for a technique. The upper threshold would establish a signal level which, if the measured signal were above, would indicate that the lead was properly connected. The lower threshold would establish a signal level which, if the measured signal were below, would indicate that the lead was not properly connected.

If the measured signal were between the two thresholds, measurements would then be made with the second technique. If measurements for the second technique were above the threshold, no fault would be indicated. If the measurements were below the threshold, a fault would be indicated.

The numeric values of thresholds vary for the type of parts used on the printed circuit board and the specific design of the printed circuit board.

Having described one embodiment, numerous alternative embodiments or variations might be made. For example, sensor 104 is shown to be configured for capacitive coupling by connecting a signal between antenna elements on two different layers of a printed circuit board to approximate the effect of connecting the signal between two closely spaced parallel plates. It is possible that all spiral loop antennas might be formed on one layer of a printed circuit board. In that instance, the inputs and outputs of all of the elements might be connected together. With such a connection, the spiral loop antennas would approximate a single conductive plate. A signal might be driven to that single point of connection and the antenna elements would then act as the electrode of the test system in U.S. Pat. No. 5,124,660 to Cilingiroglu.

As another variation, the printed circuit board on which sensor 104 is formed might include a grounded layer above the spiral loop antennas. If the sensor is wired to allow a signal to be connected to that ground layer, the ground layer could act as a parallel plate. It could be the parallel plate used to form an electrode in U.S. Pat. No. 5,124,660. Alternatively, it could be one of the two parallel plates as shown in FIG. 3. In that instance, the second parallel plate could be formed by interconnecting the antenna elements on one or more levels of the printed circuit board making up sensor 104.

Also, FIG. 2 shows spiral loop antenna elements. While such antenna elements are desirable because of the magnetic field they radiate, other types of antenna elements might also be used.

FIG. 1 shows that two sources are used to drive groups of antenna elements which are out of phase by 90°. A single source might be used in conjunction with a phase shift network.

Also, it was shown that the antenna elements were divided into two groups and within each group the antenna elements were divided into pairs wired to be 180° out of phase. Any number of groups might be used and any type of wiring might be used between the elements in each group. It is desirable, though, that the phases of the antenna elements in each group be staggered such that the signals generated by all the antenna elements cancel in the far field.

In a preferred embodiment, the tester of the invention is part of a bed of nails board tester. The invention might easily be manufactured as a separate unit.

Further, it was described that each lead was, in the preferred embodiment, tested with either an inductive or a capacitive technique. It was also described that the test to be used was selected in advance and recorded in a test program. Such a configuration reduces total test time. However, the signal levels might be measured using both techniques during a test and a choice might then be made as to which technique provided the larger Signal. Moreover, rather than basing the choice on the larger signal, the choice might be based on an estimate of the signal to noise ratio or some other parameter.

As another variation, it was described that sensors 104 are used only to drive a signal to the printed circuit board under test 100. A test signal might be injected into the circuit board under test 100 and measured by sensors 104.

Further, it was described that for capacitive coupling, the two ends of each group of antenna elements were connected together and driven by a common signal. The invention could still function if only one end of each element were driven and the other end were unconnected.

Therefore, the invention should be limited only by the spirit and scope of the appended claims.

What is claimed is:

1. A manufacturing defect analyzer for testing a printed circuit board having a plurality of components disposed on it, comprising:
   (a) a plurality of sensors, each sensor:
      (i) adapted to be disposed above one of the components on the printed circuit board;
      (ii) having a plurality of layers having conductive traces on at least one layer, the conductive traces forming at least one conductive path between a first point and a second point; and
      (iii) at least two terminals, one such terminal connected to the first point and one such terminal connected to the second point;
   (b) test control means for:
      (i) connecting the sensor to allow a current flow between the two terminals of the sensor and measuring a test signal inductively coupled between the printed circuit board and the sensor; and
      (ii) connecting the sensor to prevent a current flow between the two terminals of the sensor and measuring a test signal capacitively coupled between the printed circuit board and the sensor.

2. The manufacturing defect analyzer of claim 1 wherein the test control means comprises a switch connecting the two terminals of the sensor together for connecting the sensor to prevent current flow between the two terminals.

3. The manufacturing defect analyzer of claim 1 wherein the test control means comprises a signal source and means for connecting the signal source between the two terminals for allowing a current flow between the two terminals.

4. The manufacturing defect analyzer of claim 1 wherein the test control means comprises a meter and means for connecting the meter between the two terminals for allowing a current flow between the two terminals.

5. The manufacturing defect analyzer of claim 1 wherein the conductive traces form spiral loop antennas.

6. The manufacturing defect analyzer of claim 1 wherein the test control means comprises:
   (a) a bed of nails;
   (b) a selector connected to the bed of nails;
   (c) a current meter, a voltage meter and a bias source connected to the selector; and
   (d) a microprocessor connected to the current meter and the voltage meter and the selector.

7. Automatic test apparatus for testing a printed circuit board having a plurality of components thereon, comprising:
   (a) a plurality of sensors, each sensor having a plurality of layers with conductive elements formed on at least two layers, the conductive elements on at least one layer being traces electrically connecting an input point and an output point;
   (b) an RF signal source;
   (c) first switch means, having a control input and responsive to signals at its control input, for connecting the RF signal source between the input point and the output point or between conductive elements on different layers of a sensor;
   (d) a plurality of probes adapted to make contact to points on the printed circuit board under test;
   (e) a means for measuring voltage;
   (f) a means for measuring current;
   (g) second switch means, having a control input and responsive to the signals at its control input, for switchably connecting the voltage measuring means and the current measuring to selected ones of the plurality of probes; and
   (h) control means, coupled to the control input of the first switch means and the second switch means, for generating control signals to connect the voltage measuring means to selected ones of the plurality of probes while the RF signal source is connected between the input and output points and for generating control signals to connect the current measuring means to selected ones of the plurality of probes when the RF signal source is connected between conductive elements on different layers of a sensor.

8. The automatic test apparatus of claim 7 additionally comprising a bias source connected to the second switch means and wherein the control means generates commands to connect the bias source to selected ones of the plurality of probes while the RF signal source is connected between the input and output points.

9. The automatic test apparatus of claim 7 additionally comprising means for processing the output of the means for measuring voltage and the means for measuring current to identify manufacturing defects.

10. The automatic test apparatus of claim 7 wherein each of the plurality of sensors comprises a multilayer printed circuit board.

11. The automatic test apparatus of claim 7 wherein one of the conductive elements comprises a ground plane.

12. The automatic test apparatus of claim 7 wherein one of the conductive elements comprises a spiral loop antenna element.

13. The automatic test apparatus of claim 12 wherein the one of the conductive elements comprises two spiral loop antennas connected together, with a first of the spiral antennas wound clockwise and a second of the spiral antennas wound counter clockwise.

14. The automatic test apparatus of claim 7 wherein the conductive elements on at least two layer comprise conductive traces.

15. A method of testing a printed circuit board having a plurality of components with each component having a plurality of leads connected to traces on the printed circuit board, comprising the steps of:
   (a) configuring a sensor near a first one of the plurality of components to generate a magnetic field in the vicinity of the first component;
   (b) measuring the voltage induced by the magnetic field in a loop on the printed circuit board including a first one of the leads of the first component;
   (c) configuring the same sensor to generate an electric field in the vicinity of the first component;
   (d) measuring a current flow capacitively coupled from the sensor, through a lead on the first component to a trace on a printed circuit board; and
   (e) detecting a defect on the printed circuit board when the measured voltage is below a threshold value or the measured current is below a threshold value.

16. The method of claim 15 wherein the step of measuring voltage comprises first connecting a bias source in the loop.

17. The method of claim 15 wherein the steps of measuring a voltage in a loop including a lead and measuring current through a lead involve the same lead.

18. The method of claim 15 wherein the steps of measuring a voltage in a loop including a lead and measuring current through a lead involve different leads.

19. The method of claim 15 wherein the step of configuring a sensor to generate a magnetic field comprises applying an RF signal across two ends of a first conductive trace in the sensor.

20. The method of claim 19 wherein the step of configuring a sensor to generate an electric field comprises connecting the two ends of the first conductive trace together.

21. The method of claim 19 wherein the step of configuring a sensor to generate an electric field comprises applying an RF signal between the first conductive trace and a second conductive trace, with the first and second conductive traces being disposed in parallel planes.

* * * * *